US009576887B2

(12) United States Patent
Cho et al.

(10) Patent No.: US 9,576,887 B2
(45) Date of Patent: *Feb. 21, 2017

(54) SEMICONDUCTOR PACKAGE INCLUDING CONDUCTIVE CARRIER COUPLED POWER SWITCHES

(71) Applicant: Infineon Technologies Americas Corp., El Segundo, CA (US)

(72) Inventors: Eung San Cho, Torrance, CA (US); Andrew N. Sawle, East Grinstead (GB); Mark Pavier, Felbridge (GB); Daniel Cutler, Betchworth (GB)

(73) Assignee: Infineon Technologies Americas Corp., El Segundo, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/021,661

(22) Filed: Sep. 9, 2013

(65) Prior Publication Data

US 2014/0110776 A1    Apr. 24, 2014

Related U.S. Application Data

(60) Provisional application No. 61/715,662, filed on Oct. 18, 2012.

(51) Int. Cl.
*H01L 23/495*   (2006.01)
*H01L 25/07*    (2006.01)
(Continued)

(52) U.S. Cl.
CPC ...... *H01L 23/49575* (2013.01); *H01L 23/492* (2013.01); *H01L 23/49562* (2013.01);
(Continued)

(58) Field of Classification Search
CPC ........... H01L 29/7827; H01L 29/66666; H01L 24/18; H01L 23/36; H01L 23/49517;
(Continued)

(56) References Cited

U.S. PATENT DOCUMENTS

| 8,120,158 | B2 | 2/2012 | Ewe | |
|---|---|---|---|---|
| 2002/0175661 | A1* | 11/2002 | Wheeler | H02M 1/088 323/282 |
| 2004/0061221 | A1* | 4/2004 | Schaffer | H01L 24/36 257/723 |
| 2007/0063216 | A1* | 3/2007 | Hu | H01L 23/3121 257/119 |

(Continued)

FOREIGN PATENT DOCUMENTS

WO    WO 01/37338    5/2001

*Primary Examiner* — David Vu
*Assistant Examiner* — Mouloucoulaye Inoussa
(74) *Attorney, Agent, or Firm* — Shumaker & Seiffert, P.A.

(57) ABSTRACT

In one implementation, a semiconductor package including conductive carrier coupled power switches includes a first vertical FET in a first active die having a first source and a first gate on a source side of the first active die and a first drain on a drain side of the first active die. The semiconductor package also includes a second vertical FET in a second active die having a second source and a second gate on a source side of the second active die and a second drain on a drain side of the second active die. The semiconductor package includes a conductive carrier attached to the source side of the first active die and to the drain side of the second active die, the conductive carrier coupling the first source to the second drain.

20 Claims, 9 Drawing Sheets

(51) Int. Cl.
  *H01L 25/11* (2006.01)
  *H01L 23/492* (2006.01)
(52) U.S. Cl.
  CPC .......... *H01L 25/072* (2013.01); *H01L 25/115* (2013.01); *H01L 2224/32245* (2013.01); *H01L 2224/73253* (2013.01); *H01L 2924/13091* (2013.01)
(58) Field of Classification Search
  CPC ......... H01L 23/49562; H01L 23/49575; H01L 25/072; H01L 25/115; H01L 23/3107; H01L 23/492; H01L 2224/73253; H01L 23/4957
  USPC ................ 257/368, 329, 666, 777, E25.027; 438/268, 123
  See application file for complete search history.

(56) References Cited

U.S. PATENT DOCUMENTS

| | | | |
|---|---|---|---|
| 2008/0029906 A1* | 2/2008 | Otremba | H01L 23/3121 257/778 |
| 2008/0048342 A1* | 2/2008 | Cheah | H01L 23/49524 257/777 |
| 2009/0201072 A1* | 8/2009 | Honea | H03K 17/08142 327/424 |
| 2010/0013011 A1 | 1/2010 | Ashrafzadeh | |
| 2011/0031611 A1 | 2/2011 | Standing | |
| 2011/0108971 A1 | 5/2011 | Ewe | |
| 2011/0127675 A1 | 6/2011 | Ewe | |
| 2011/0210708 A1 | 9/2011 | Herbsommer | |
| 2012/0274366 A1* | 11/2012 | Briere | H02M 7/003 327/108 |

* cited by examiner

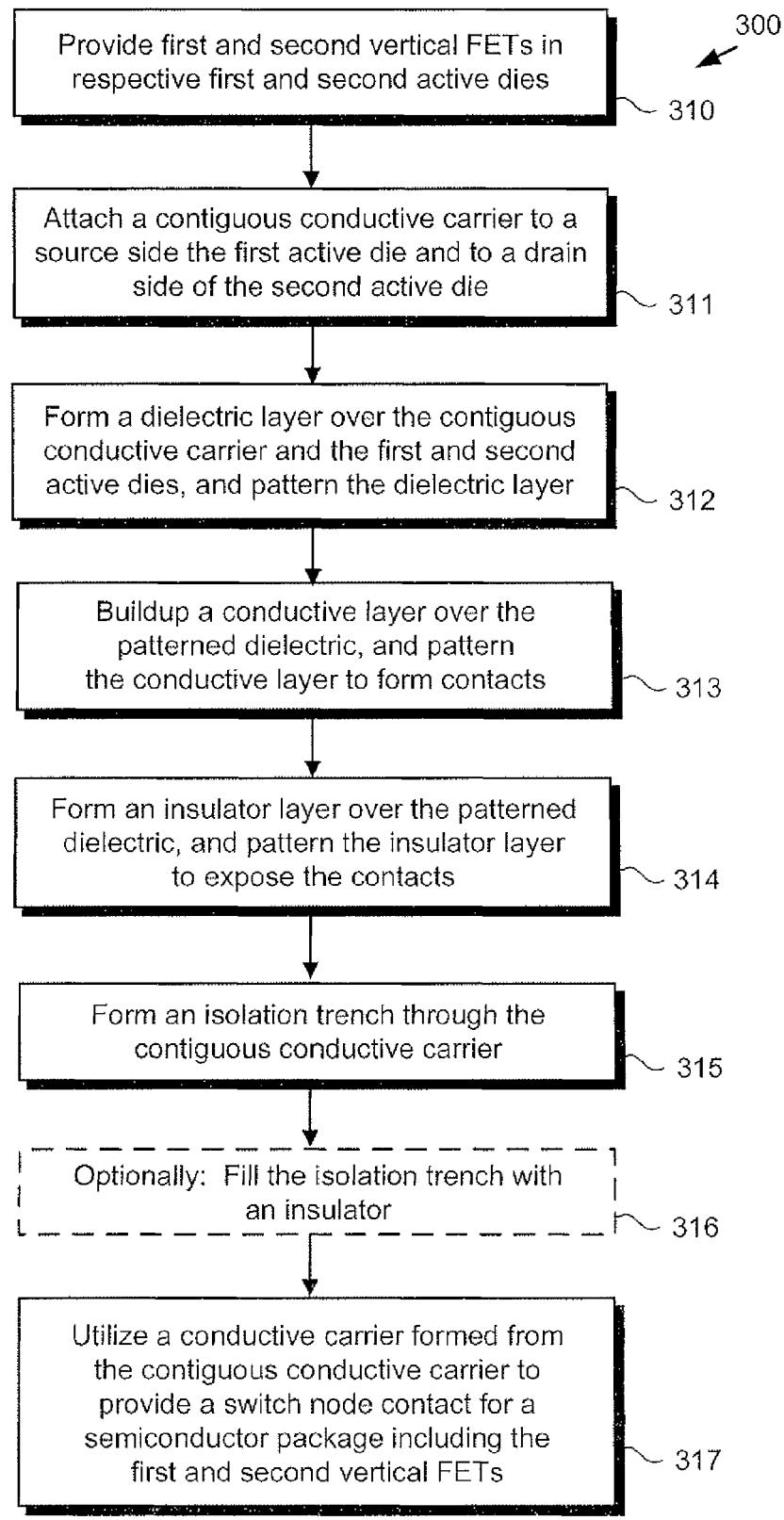

SEMICONDUCTOR PACKAGE INCLUDING CONDUCTIVE CARRIER COUPLED POWER SWITCHES

The present application claims the benefit of and priority to a provisional application entitled "Semiconductor Package Including Lead Frame Coupled Power Switches," Ser. No. 61/715,662 filed on Oct. 18, 2012. The disclosure in this provisional application is hereby incorporated fully by reference into the present application.

BACKGROUND

Background Art

Power converters are used in a variety of electronic circuits and systems. Many integrated circuit (IC) applications, for instance, require conversion of a direct current (DC) input to a lower, or higher, DC output. For example, a synchronous buck converter may be implemented as a voltage regulator to convert a higher voltage DC input to a lower voltage DC output for use in low voltage applications in which relatively large output currents are required.

The voltage converted output of a synchronous buck converter is typically provided through a switch node situated between a high side control switch and a low side synchronous (sync) switch of the power converter switching stage. The electrical connection between the control and sync power switches may be implemented using a conductive clip, such as a copper clip, which must be sufficiently robust to accommodate high current. Moreover, because the control and sync power switches can be very sensitive to electrical resistance, the cross-sectional area of the conductive clip used to provide the switch node is often relatively large. Consequently, packaging solutions for such power converters must typically be sized to accommodate not only the control and sync switches of the power converter switching stage, but a relatively large conductive clip for connection of those power switches as well.

SUMMARY

The present disclosure is directed to a semiconductor package including conductive carrier coupled power switches, substantially as shown in and/or described in connection with at least one of the figures, and as set forth more completely in the claims.

BRIEF DESCRIPTION OF THE DRAWINGS

FIG. 3 shows a flowchart presenting one exemplary method for fabricating a semiconductor package including conductive carrier coupled power switches.

DETAILED DESCRIPTION

Figure 1:
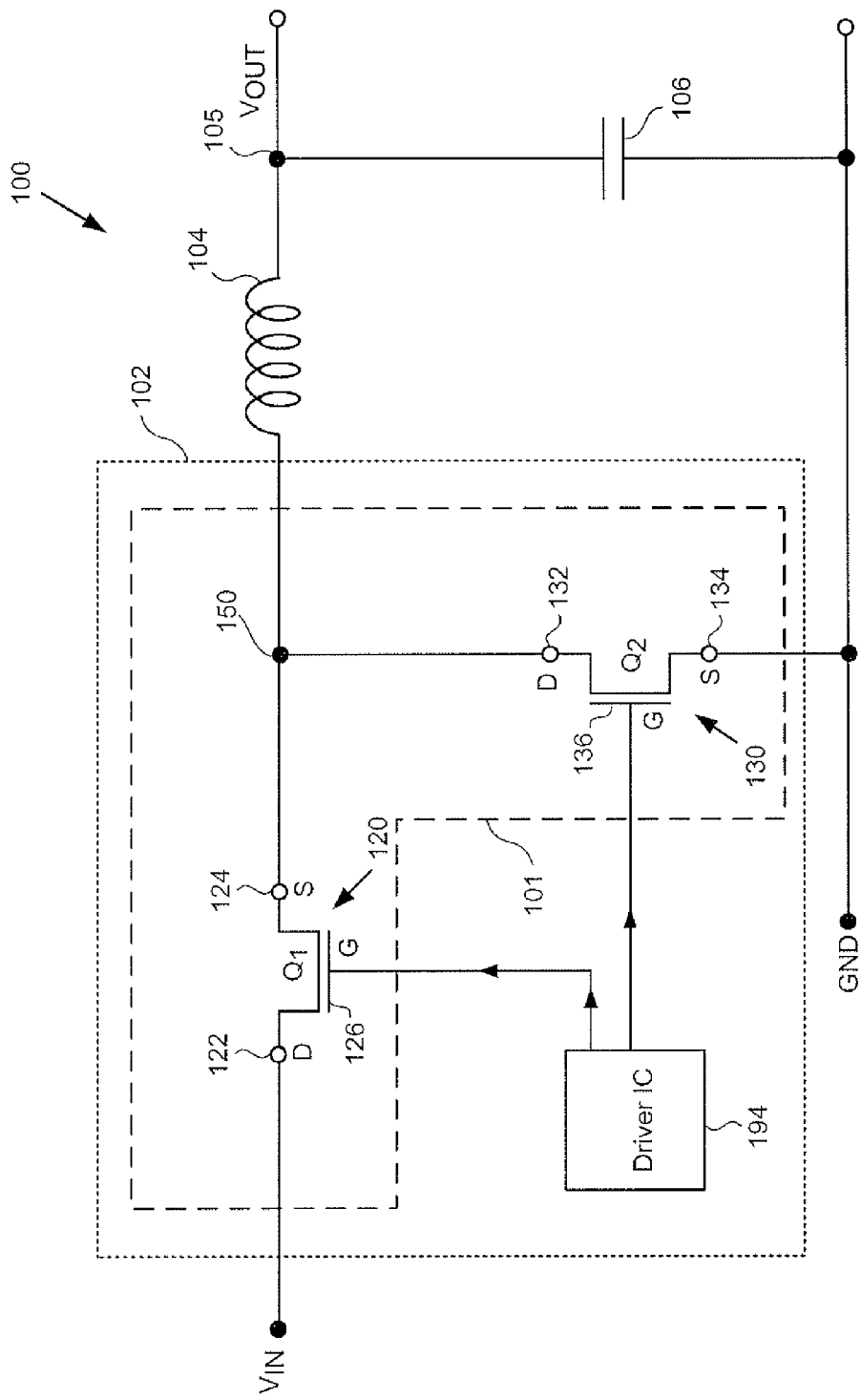
FIG. 1 shows a diagram of an exemplary power converter circuit.

The following description contains specific information pertaining to implementations in the present disclosure. One skilled in the art will recognize that the present disclosure may be implemented in a manner different from that specifically discussed herein. The drawings in the present application and their accompanying detailed description are directed to merely exemplary implementations. Unless noted otherwise, like or corresponding elements among the figures may be indicated by like or corresponding reference numerals. Moreover, the drawings and illustrations in the present application are generally not to scale, and are not intended to correspond to actual relative dimensions.

As stated above, power converters such as voltage regulators are used in a variety of electronic circuits and systems. For instance, and as noted above, integrated circuit (IC) applications may require conversion of a direct current (DC) input to a lower, or higher, DC output. As a specific example, a buck converter may be implemented as a voltage regulator to convert a higher voltage DC input to a lower voltage DC output for use in low voltage applications in which relatively large output currents are required.

FIG. 1 shows a diagram of an exemplary power converter circuit. Power converter 100 includes power converter multi-chip module (MCM) 102, output inductor 104, and output capacitor 106. As shown in FIG. 1, MCM 102 includes switching stage 101 of power converter 100, and driver IC 194 implemented to provide drive signals to switching stage 101. As shown in FIG. 1, power converter 100 is configured to receive an input voltage $V_{IN}$, and to provide a converted voltage, e.g., a rectified and/or stepped down voltage, as $V_{OUT}$ at output 105.

Switching stage 101 may be implemented using two power switches in the form of metal-oxide-semiconductor field-effect transistors (MOSFETs) configured as a half bridge, for example. That is to say, switching stage 101 may include high side or control switch 120 ($Q_1$) having drain 122, source 124, and gate 126, as well as low side or synchronous (sync) switch 130 ($Q_2$) having drain 132, source 134, and gate 136. Control switch 120 is coupled with sync switch 130 at switch node 150, which, in turn, is coupled to output 105 through output inductor 104. Respective control and sync switches 120 and 130 may be implemented as group IV based power devices, such as silicon power MOSFETs fabricated as vertical FETs, for example. Power converter 100 may be advantageously utilized as a voltage converter, for example a buck converter, in a variety of automotive, industrial, appliance, and lighting applications.

It is noted that in the interests of ease and conciseness of description, the present inventive principles will in some instances be described by reference to specific implementations of a buck converter including one or more silicon based power transistors. However, it is emphasized that such implementations are merely exemplary, and the inventive principles disclosed herein are broadly applicable to a wide range of applications, including buck and boost converters, implemented using other group IV material based, or group III-V semiconductor based, power transistors. It is noted that as used herein, the phrase "group III-V" refers to a compound semiconductor including at least one group III element and at least one group V element. By way of example, a group III-V semiconductor may take the form of a III-Nitride semiconductor that includes nitrogen and at least one group III element. For instance, a III-Nitride power transistor may be fabricated using gallium nitride (GaN), in which the group III element or elements include some or a substantial amount of gallium, but may also include other group III elements in addition to gallium.

As noted above, the connection between control switch 120 and sync switch 130 providing switch node 150 can be implemented using a conductive clip, such as a copper clip, which must be sufficiently robust to accommodate high current. Moreover, because control switch 120 and sync switch 130 can be very sensitive to electrical resistance, the cross-sectional area of the conductive clip used to provide switch node 150 is often relatively large. Consequently, packaging solutions for power converters, such as a power switching module containing switching stage 101, or MCM 102 including switching stage 101 and driver IC 194, must be sized to accommodate a large conductive clip for connection of the power switches.

Figure 2:
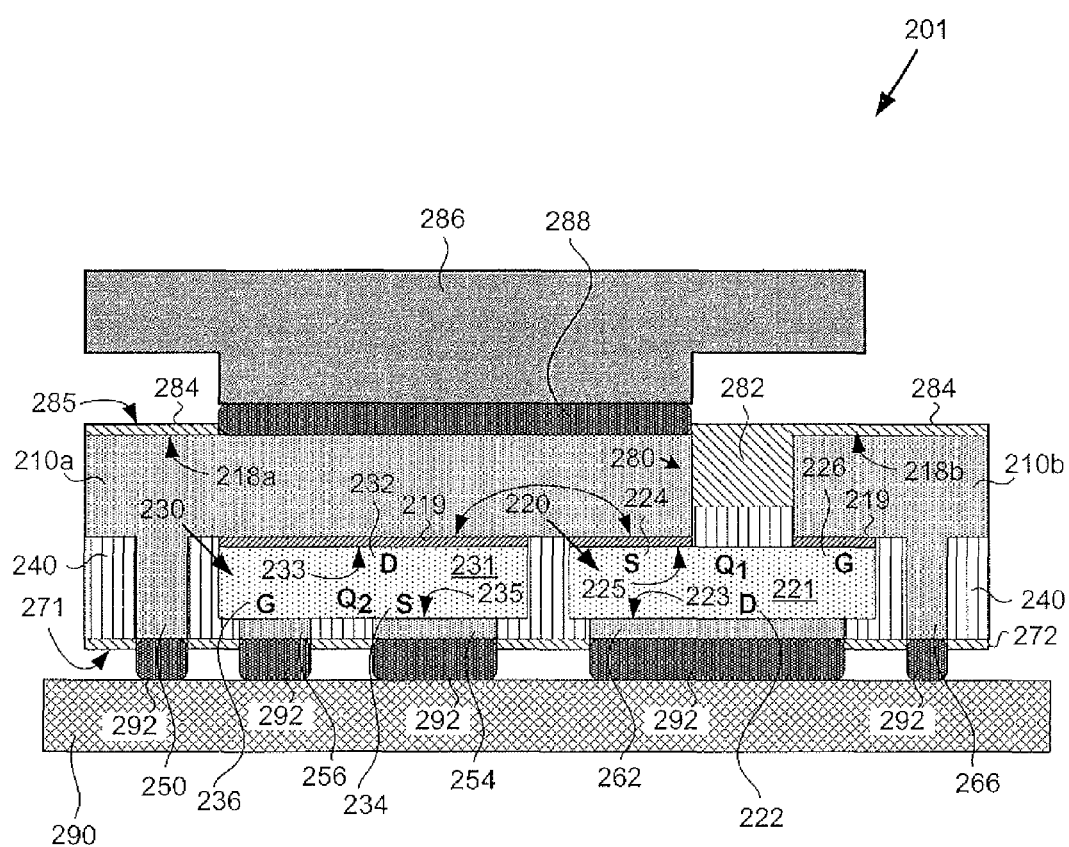
FIG. 2 shows a cross-sectional view of an exemplary semiconductor package including conductive carrier coupled power switches, according to one implementation.

The present application discloses a packaging solution enabling omission of such a conductive clip, or any other feature implemented solely or primarily as a switch node electrical connector, while concurrently providing a reliable, low resistance, and substantially parasitic free electrical connection for establishing switch node 150. In one implementation, a conductive carrier utilized as a structural support in the packaging solution, such as a conductive lead frame for example, is configured to couple control switch 120 to sync switch 130 so as to provide switch node 150. In one such implementation, the conductive carrier may provide a substantially direct electrical connection between source 124 of control switch 120 and drain 132 of sync switch 130. FIG. 2 shows an exemplary representation of such a packaging solution.

FIG. 2 shows a cross-sectional view of semiconductor package 201 mounted on printed circuit board (PCB) 290 by solder bodies 292 at surface 271 of semiconductor package 201. Semiconductor package 201 includes control switch $Q_1$ implemented as first vertical FET 220 in first or control active die 221, and sync switch $Q_2$ implemented as second vertical FET 230 in second or sync active die 231. First vertical FET 220 includes source 224 and gate 226 on source side 225 of first or control active die 221, as well as drain 222 on drain side 223 of first or control active die 221. Second vertical FET 230 includes source 234 and gate 236 on source side 235 of second or sync active die 231, as well as drain 232 on drain side 233 of second or sync active die 231.

Semiconductor package 201 further includes conductive carriers 210a and 210b having respective surfaces 218a and 218b, electrically conductive die attach material 219, patterned dielectric 240, insulator 282 filling isolation trench 280, and patterned insulator layers 272 and 284. As shown in FIG. 2, conductive carrier 210a may be attached to source side 225 of first active die 221 and to drain side 233 of second active die 231 so as to couple source 224 to drain 232. As further shown in FIG. 2, conductive carrier 210b may be attached to gate 226 on source side 225 of first active die 221. Also included in semiconductor package 201 are drain contact 262, source contact 254, gate contact 256, gate contact 266 provided by conductive carrier 210b, switch node contact 250 provided by conductive carrier 210a, and heat spreader 286 mounted to conductive carrier 210a by solder body 288 through surface 285.

Semiconductor package 201 corresponds in general to switching stage 101 in FIG. 1. In addition, first vertical FET 220 having drain 222, source 224, and gate 226, and second vertical FET 230 having drain 232, source 234, and gate 236, correspond in general to control switch 120 having drain 122, source 124, and gate 126, and sync switch 130 having drain 132, source 134, and gate 136, respectively, in FIG. 1. In other words, first and second vertical FETs 220 and 230, in FIG. 2, may be utilized to implement switching stage 101 of power converter 100, in FIG. 1. Moreover, switch node contact 250, in FIG. 2, corresponds to switch node 150 of switching stage 101, in FIG. 1.

The features of semiconductor package 201 will be now be described in greater detail by reference to FIG. 3, and FIGS. 4A, 4B, 4C, 4D, 4E, 4F, and 4G (hereinafter "FIGS. 4A-4G"). However, it is noted in reference to FIG. 2 that the electrical connection between source 224 of first vertical FET 220 and drain 232 of second vertical FET 230 is established in the absence of a conductive clip or other feature implemented solely or primarily as an electrical connector. Instead, according to the implementation shown in FIG. 2, the coupling of source 224 to drain 232 that establishes switch node contact 250 is advantageously provided by conductive carrier 210a and conductive die attach material 219. As a result, the packaging solution of FIG. 2 provides a robust, low resistance, and low parasitic electrical conduction path for providing switch node contact 250. Moreover, the inventive concepts disclosed by the packaging solution represented in FIG. 2 can be extended to enable the fabrication of high density MCM packages, with reduced parasitics.

Referring to FIG. 3, FIG. 3 shows flowchart 300 presenting an exemplary method for fabricating a semiconductor package including conductive carrier coupled power switches. It is noted that the method described by flowchart 300 is performed on a conductive carrier, which may be a semiconductor package lead frame, or may take the form of a conductive sheet or plate, for example.

Figure 4A:
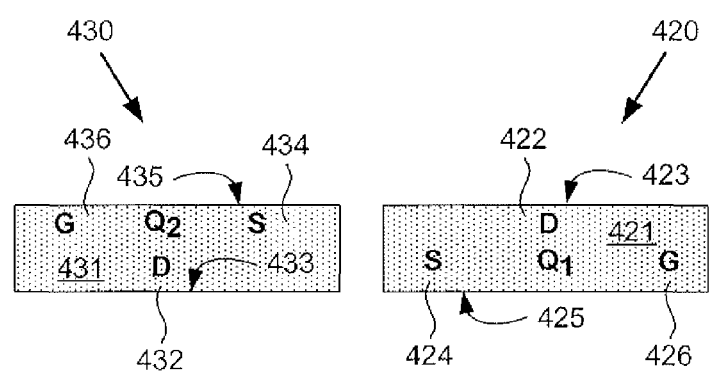
FIG. 4A depicts an initial stage of the method described in FIG. 3.
Figure 4B:
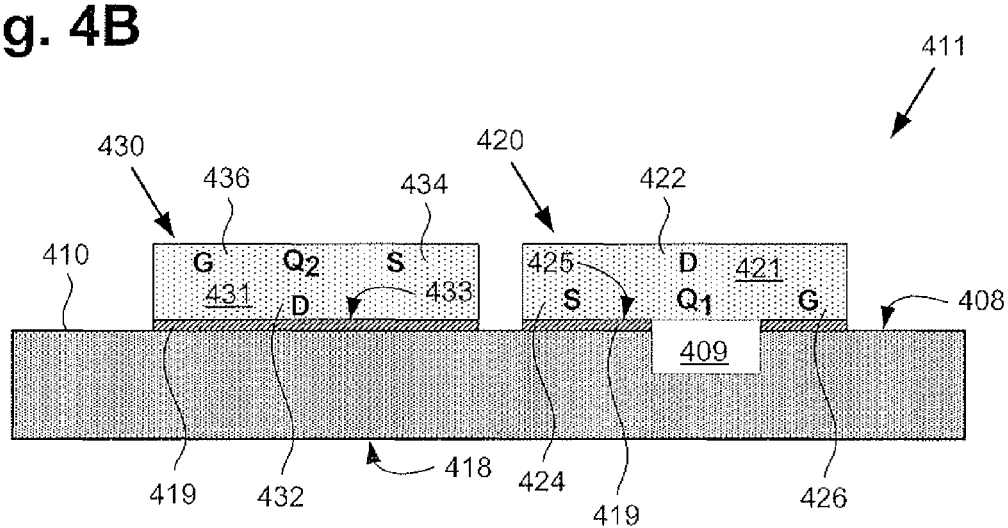
FIG. 4B shows an exemplary structure corresponding to an intermediate stage of the method described in FIG. 3.
Figure 4C:
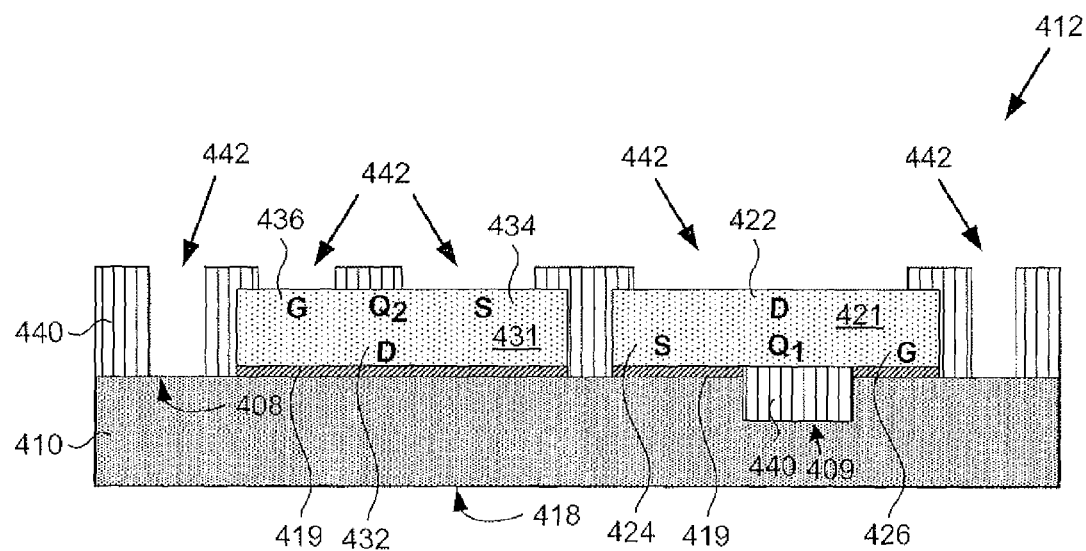
FIG. 4C shows the exemplary structure in FIG. 4B at another intermediate stage of the fabrication method described in FIG. 3.

With respect to FIGS. 4A-4G, those figures illustrate the result of performing the method of flowchart 300. For example, FIG. 4A depicts first and second vertical FETS 420 and 430 (310), structure 411 in FIG. 4B shows a portion of contiguous conductive carrier 410 attached to first and second vertical FETs 420 and 430 (311), structure 412 in FIG. 4C shows structure 411 after the formation and patterning of a dielectric layer (312), and so forth. It is noted that contiguous conductive carrier 410, in FIGS. 4B through 4E, and conductive carriers 410a and 410b in FIGS. 4F and 4G, correspond in general to conductive carriers 210a and 210b, in FIG. 2. It is further noted that although FIGS. 4A-4G depict formation of a structure including one dielectric layer and one conductive buildup layer, other implementations using the present concepts may include more than one dielectric layer and more than one conductive buildup layer.

Referring to flowchart 300, in FIG. 3, in combination with FIG. 4A, flowchart 300 begins with providing first and second vertical FETs 420 and 430 in respective first and second active dies 421 and 431 (310). As shown in FIG. 4A, in one implementation, first vertical FET 420 may be used to provide control switch $Q_1$ having source 424 and gate 426 on source side 425 of first or control active die 421, and drain 422 on drain side 423 of first or control active die 421. Second vertical FET 430 may be used to provide sync switch $Q_2$ having source 434 and gate 436 on source side 435 of second or sync active die 431, and drain 432 on drain side 433 of second or sync active die 431.

In one implementation, first and second vertical FETs 420 and 430 providing respective control and sync switches $Q_1$ and $Q_2$ may take the form of group IV material based vertical FETs, such as silicon vertical MOSFETs for example. However, in other implementations, control and sync switches $Q_1$ and $Q_2$ may take the form of group III-V based power transistors, such as GaN or other III-Nitride based FETs. First vertical FET 420 in first or control active die 421 and second vertical FET 430 in second or sync active die 431 correspond respectively to first vertical FET 220 in first or control active die 221 and second vertical FET 230 in second or sync active die 231, in FIG. 2.

Moving to structure 411 in FIG. 4B with ongoing reference to FIG. 3, flowchart 300 continues with attaching contiguous conductive carrier 410 to source side 425 of first or control active die 421 and to drain side 433 of second or sync active die 431 (311). As shown in FIG. 4B, contiguous conductive carrier 410 is represented as a pre-patterned conductive sheet or plate having top surface 408, bottom surface 418, and cavity 409 pre-patterned at top surface 408. Contiguous conductive carrier 410 may be formed of any conductive material having a suitably low electrical resistance. Examples of materials from which contiguous conductive carrier 410 may be formed include copper (Cu), aluminum (Al), or a conductive alloy. As noted above, in one implementation, contiguous conductive carrier 410 may be implemented using a semiconductor package lead frame.

Although the present exemplary implementation shows contiguous conductive carrier 410 as a pre-patterned sheet or plate including a single cavity 409 at top surface 408, in other implementations, contiguous conductive carrier 410 may be pre-patterned to have multiple cavities, corresponding to cavity 409, at top surface 408. Furthermore, although the present exemplary implementation shows contiguous conductive carrier 410 as a pre-patterned sheet or plate, that need not always be the case. For example, in other implementations of the present method, an unpatterned conductive sheet or plate from which cavities corresponding to cavity 409 are omitted may be used as contiguous conductive carrier 410.

Moreover, although not shown in the present figures, in some implementations, contiguous conductive carrier 410, whether pre-patterned or unpatterned, may include a barrier metal layer formed on one or both of top surface 408 and bottom surface 418. Such a barrier metal layer may be formed of nickel-gold (NiAu) or nickel-palladium-gold (NiPdAu), for example. In some implementations, such a barrier metal layer may serve as an etching mask during patterning or pre-patterning of contiguous conductive carrier 410. Thereafter, such a barrier metal layer can provide a solderable surface at one or both of top surface 408 and bottom surface 418 of contiguous conductive carrier 410.

As shown in FIG. 4B, top surface 408 of contiguous conductive carrier 410 is attached to source side 425 of first or control active die 421 and to drain side 433 of second or sync active die 431 by die attach material 419, which, according to the present exemplary implementation is an electrically conductive die attach material. It is noted that first or control active die 421 and second or sync active die 431 are flipped relative to each other. That is to say, second or sync active die 431 is disposed on contiguous conductive carrier 410 in a "face up" orientation in which drain 432 is attached to top surface 408, while first or control active die 421 is oriented "face down" such that source 424 and gate 426 are attached to top surface 408. Moreover, and as further shown in FIG. 4B, first or control active die 421 is disposed over cavity 409 such that cavity 409 is situated between the attachment of source 424 to top surface 408 and the attachment of gate 426 to top surface 408, by electrically conductive die attach material 419.

Electrically conductive die attach material 419 may be any suitable substance, such as a conductive epoxy, solder, a conductive sintered material, or diffusion bonded material, and may be formed to a thickness of from approximately 0.5 mm to approximately 2.0 mm, for example. Electrically conductive die attach material 419 corresponds to electrically conductive die attach material 219, in FIG. 2, while contiguous conductive carrier 410, in FIG. 4B, corresponds in general to, and serves as a foundational structure for, conductive carriers 210a and 210b, in FIG. 2.

As shown by structure 412 in FIG. 4C, flowchart 300 continues with forming a dielectric layer over contiguous conductive carrier 410, first or control active die 421, and second or sync active die 431, followed by patterning of the dielectric layer to form patterned dielectric 440 (312). Patterned dielectric 440 may be formed by initially laminating a pre-formed dielectric layer onto contiguous conductive carrier 410, first or control active die 421, and second or sync active die 431, and then patterning the pre-formed dielectric layer to produce windows 442. Such a pre-formed dielectric layer may be cut or otherwise patterned from a pre-formable dielectric material, such as an epoxy-phenolic or cyanate ester-epoxy build-up material, for example, or any other pre-formable dielectric utilized in laminate substrate technology. In one implementation, for example, patterned dielectric 440 may be formed of a B-stage polymeric material cured during lamination. As a result, pre-formed dielectric 440 can substantially fill cavity 409, as shown in FIG. 4C.

Patterning of the dielectric layer to form patterned dielectric 440 including windows 442 can be performed using any known technique, such as etching. Patterned dielectric 440 includes windows 442 exposing top surface 408 of contiguous conductive carrier 410 adjacent each of first or control active die 421 and second or sync active die 431, as well as windows 442 exposing drain 422, source 434, and gate 436. Patterned dielectric 440 corresponds to patterned dielectric 240, in FIG. 2.

Figure 4D:
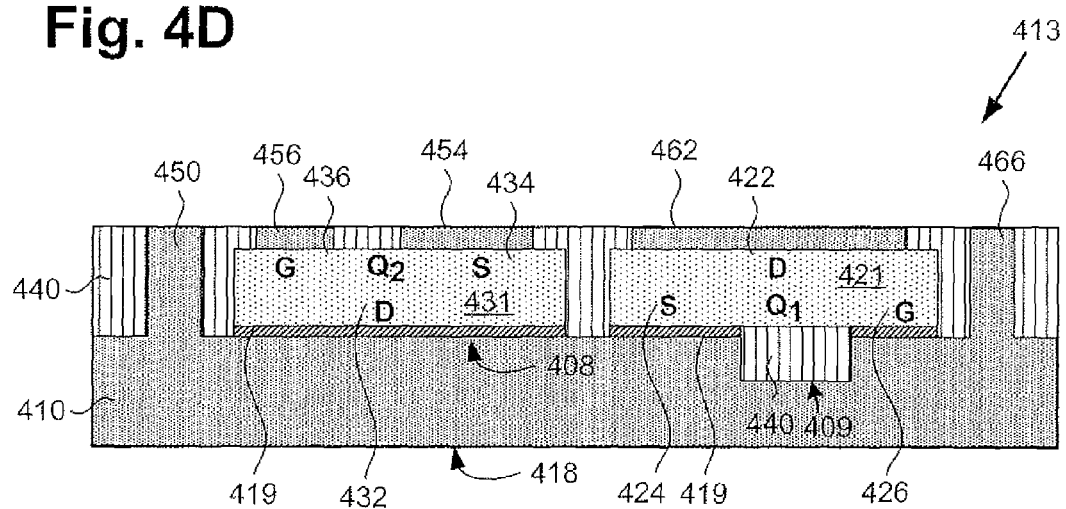
FIG. 4D shows the exemplary structure in FIG. 4C at another intermediate stage of the fabrication method described in FIG. 3.

Moving to structure 413 in FIG. 4D, flowchart 300 continues with buildup of a conductive layer over patterned dielectric 440, and patterning of the conductive layer to form contacts 462, 466, 450, 454, and 456 (313). The conductive layer may be formed of Cu or Al, for example, or may be a metal alloy, such as a metal alloy including Cu and Ni, for example. Such a conductive layer may be built up using any suitable technique, such as electrochemical deposition or an electrolytic plating process, for example. After buildup, the conductive layer is patterned to form drain contact 462, gate contacts 466 and 456, switch node contact 450, and source contact 454. Drain contact 462, gate contacts 466 and 456, switch node contact 450, and source contact 454 correspond respectively to drain contact 262, gate contacts 266 and 256, switch node contact 250, and source contact 254, in FIG. 2.

Figure 4E:
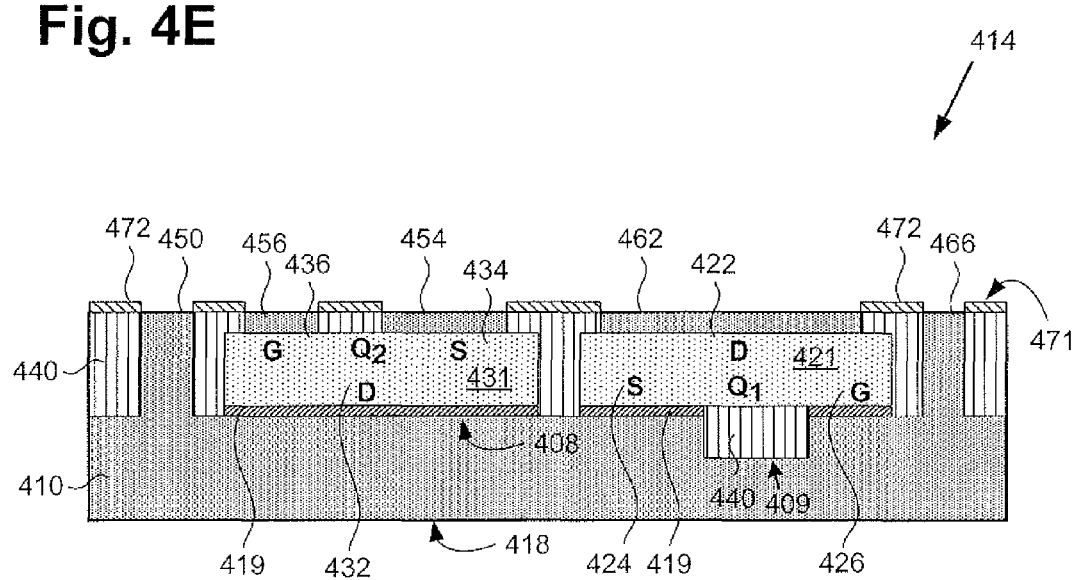
FIG. 4E shows the exemplary structure in FIG. 4D at another intermediate stage of the fabrication method described in FIG. 3.

Continuing to structure 414 in FIG. 4E, flowchart 300 continues with forming an insulator layer over patterned dielectric 440 and contacts 462, 466, 450, 454, and 456, and patterning the insulator layer to expose contacts 462, 466, 450, 454, and 456 (314). The insulator layer may be formed as a blanket layer of solder resist, for example, which is thereafter patterned to form patterned insulator layer 472 providing surface 471. Patterned insulator layer 472 providing surface 471 corresponds to patterned insulator layer 272 providing surface 271, in FIG. 2.

Figure 4F:
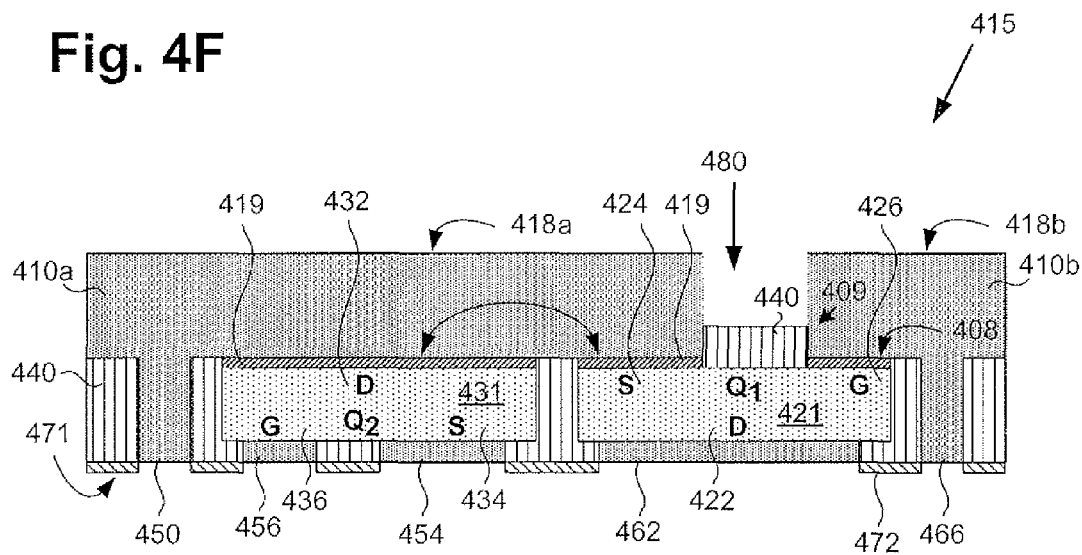
FIG. 4F shows the exemplary structure in FIG. 4E at another intermediate stage of the fabrication method described in FIG. 3.

Moving to structure 415 in FIG. 4F, flowchart 300 continues with forming isolation trench 480 through contiguous conductive carrier 410 (315). Isolation trench 480 is formed at bottom surface 418 of contiguous conductive carrier 410 and extends from bottom surface 418 to patterned dielectric 440 formed in cavity 409 at top surface 408. Moreover, in some implementations, as shown in FIG. 4F, isolation trench 480 may be substantially aligned with cavity 409.

Isolation trench 480 may be formed using any suitable technique, such as etching, or laser ablation, for example, as known in the art. Formation of isolation trench 480 results in electrical isolation of conductive carrier 410a from conductive carrier 410b. Isolation trench 480 and conductive carriers 410a and 410b having respective bottom surfaces 418a and 418b correspond respectively to isolation trench 280 and conductive carriers 210a and 210b having respective surfaces 2I 8a and 218b, in FIG. 2.

It is noted that although in the present exemplary implementation, isolation trench 480 extends from bottom surface 418 of contiguous conductive carrier 410 to patterned dielectric 440 within cavity 409, that feature results from use of a pre-patterned contiguous conductive carrier 410. In implementations in which an unpatterned conductive carrier is used, cavity 409 and its dielectric fill would typically be absent, and isolation trench 480 could be formed so as to extend from bottom surface 418, through contiguous conductive carrier 410, to top surface 408. In those implementations, isolation trench 480 could be formed through conductive carrier 410 so as to form a gap between the attachment of source 424 to top surface 408 and the attachment of gate 426 to top surface 408.

Figure 4G:
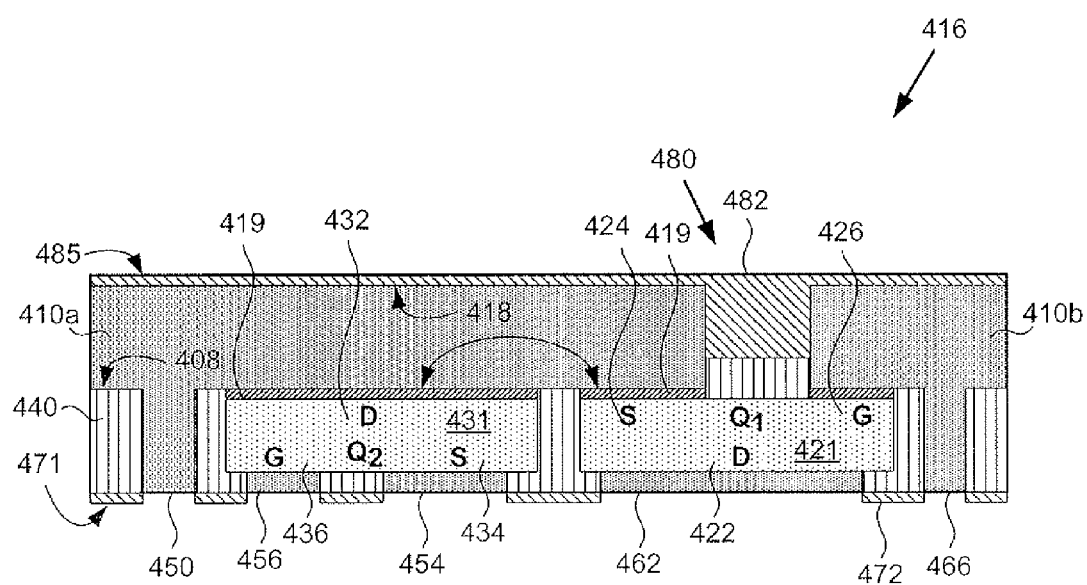
FIG. 4G shows the exemplary structure in FIG. 4F at another intermediate stage of the fabrication method described in FIG. 3.

Turning now to structure 416 in FIG. 4G, in some implementations, the method of flowchart 300 may optionally continue with filling of isolation trench 480 with insulator 482 (316). In some implementations, as shown in FIG. 4G, isolation trench 480 alone may be sufficient to provide electrical isolation between conductive carriers 410a and 410b, without the need for a dielectric fill. In other implementations, however, it may be necessary, or merely desired, to fill isolation trenches 480 with a suitable electrically insulating material. Insulator 482 may be formed of solder resist, for example, and may be deposited or otherwise formed so as to fill isolation trench 480, as well as to provide surface 485. Insulator 482 providing surface 485 corresponds to insulator 282 providing surface 285, in FIG. 2.

The method of flowchart 300 may conclude with utilizing conductive carrier 410a formed from contiguous conductive carrier 410 to provide switch node contact 450 for a semiconductor package including first and second vertical FETs 420 and 430 (317). As shown in FIGS. 4F and 4G, conductive carrier 410a couples source 424 of first vertical FET 420 to drain 432 of second vertical FET 430, and is isolated from gate 426 of first vertical FET 420 by isolation trench 480.

Referring to FIG. 2 in combination with FIGS. 4F and 4G, conductive carrier 210a/410a can be used to provide switch node contact 250/450, which in turn is configured to provide an output node of semiconductor package 201 accessible through surface 271/471. Consequently, the electrical connection between source 224/424 of first vertical FET 220/420 and drain 232/432 of second vertical FET 230/430 may be established in the absence of a conductive clip or other feature implemented solely or primarily as an electrical connector. Thus, the exemplary method of flowchart 300 enables fabrication of a semiconductor package including a robust, low resistance, and low parasitic electrical conduction path for providing switch node contact 250/450.

Figure 5:
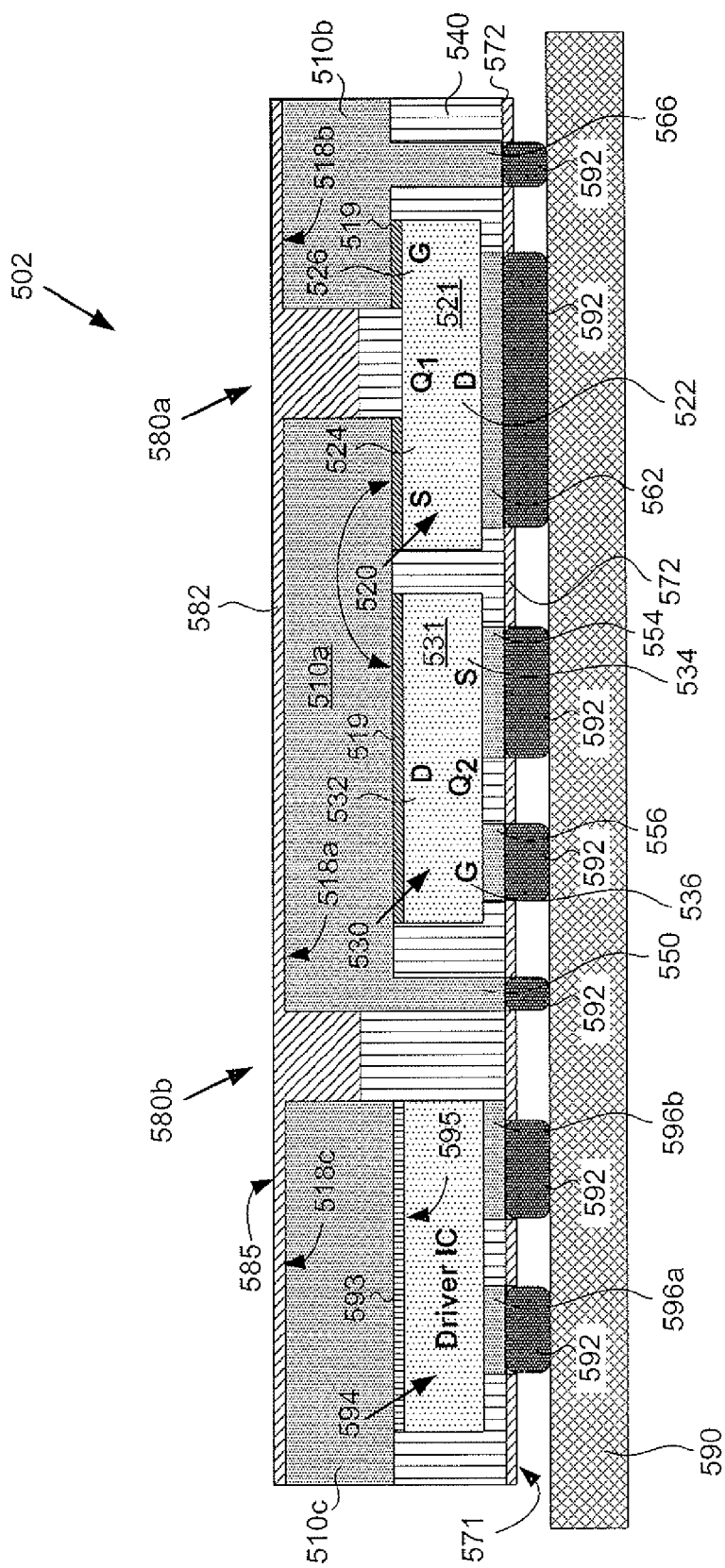
FIG. 5 shows a cross-sectional view of an exemplary semiconductor package including conductive carrier coupled power switches and a driver integrated circuit (IC) for driving one or both of the power switches, according to one implementation.

Although the implementations shown and described by reference to FIGS. 2, 3, and 4A-4G result in an MCM, such as semiconductor package 201, in FIG. 2, configured to enclose switching stage 101, in FIG. 1, in some applications, it may be desirable to produce a semiconductor package corresponding to MCM 102. An example implementation of such an MCM package is shown by FIG. 5, which depicts an exemplary semiconductor package including conductive carrier coupled power switches and a driver IC for driving one or both of the power switches, according to one implementation. One of ordinary skill in the art will readily understand that the exemplary method outlined by flowchart 300, in FIG. 3, can be suitably adapted to produce the exemplary MCM package structure shown in FIG. 5.

FIG. 5 shows a cross-sectional view of MCM 502 mounted on PCB 590 by solder bodies 592 at surface 571 of MCM 502. MCM 502 includes control active die 521 providing vertical FET 520 having drain 522, source 524, and gate 526, and implementing control switch $Q_1$. In addition, MCM 502 includes sync active die 531 providing vertical FET 530 having drain 532, source 534, and gate 536, and implementing sync switch $Q_2$. MCM 502 also includes driver IC 594 for driving one or both of control and sync switches $Q_1$ and $Q_2$.

MCM 502 further includes conductive carriers 510a, 510b, and 510c having respective surfaces 518a, 518b, and 518c, electrically conductive die attach material 519, patterned dielectric 540, insulator 582 partially filling isolation trenches 580a and 580b and forming an insulation layer at surface 585, and patterned insulator layer 572 providing surface 571. It is noted that the respective portions of isolation trenches 580a and 580b not filled by insulator 582 are filled by patterned dielectric 540. Also included in MCM 502 are drain contact 562, source contact, 554, gate contacts 566 and 556, switch node contact 550, input/output (I/O) pads 596a and 596b of driver IC 594, and die attach material 593 for attaching driver IC 594 to conductive carrier 510c.

According to the present implementation, the absence of I/O pads on side 595 of driver IC 594, as well as the insulating properties of any encapsulant or packaging of driver IC 594 may be sufficient to isolate driver IC 594 from conductive carrier 510c, to which driver IC 594 is attached. As a result, in some implementations, die attach material 593 may be an electrically conductive die attach material. However, in some implementations, die attach material 593 may be a dielectric die attach material, thereby providing additional electrical isolation between conductive carrier 510c and driver IC 594.

Conductive carriers 510a and 510b, vertical FETs 520 and 530, and electrically conductive die attach material 519 correspond respectively to conductive carriers 210a and 210b, first and second vertical FETs 220 and 230, and electrically conductive die attach material 219, in FIG. 2. In addition, patterned dielectric 540, isolation trench 580a, insulator 582, contacts 562, 566, 550, 554, and 556, and patterned insulator layer 572, in FIG. 5, correspond respectively to patterned dielectric 240, isolation trench 280, insulator 282, contacts 262, 266, 250, 254, and 256, and patterned insulator layer 272, in FIG. 2. Moreover, it is noted that MCM 502 including driver IC 594, in FIG. 5, corresponds in general to MCM 102 including driver IC 194, in FIG. 1.

According to the implementation shown in FIG. 5, conductive carrier 510a advantageously provides switch node contact 550 and thereby couples source 524 of vertical FET 520 to drain 532 of vertical FET 530. Isolation trench 580a provides electrical isolation between conductive carrier 510b, providing gate contact 566 of vertical FET 520, and conductive carrier 510a providing switch node contact 550. Moreover isolation trench 580b protects driver IC 594 from switching noise that may be present in conductive carrier 510a by electrically isolating conductive carrier 510a from conductive carrier 510c, to which driver IC 594 is attached.

It is noted that although not shown in FIG. 5, in some implementations, MCM 502 may include a heat spreader. For example, a heat spreader corresponding to heat spreader 286 in FIG. 2 may be attached to conductive carrier 510c and/or conductive carrier 510a through insulator 582 providing surface 585.

Figure 6:
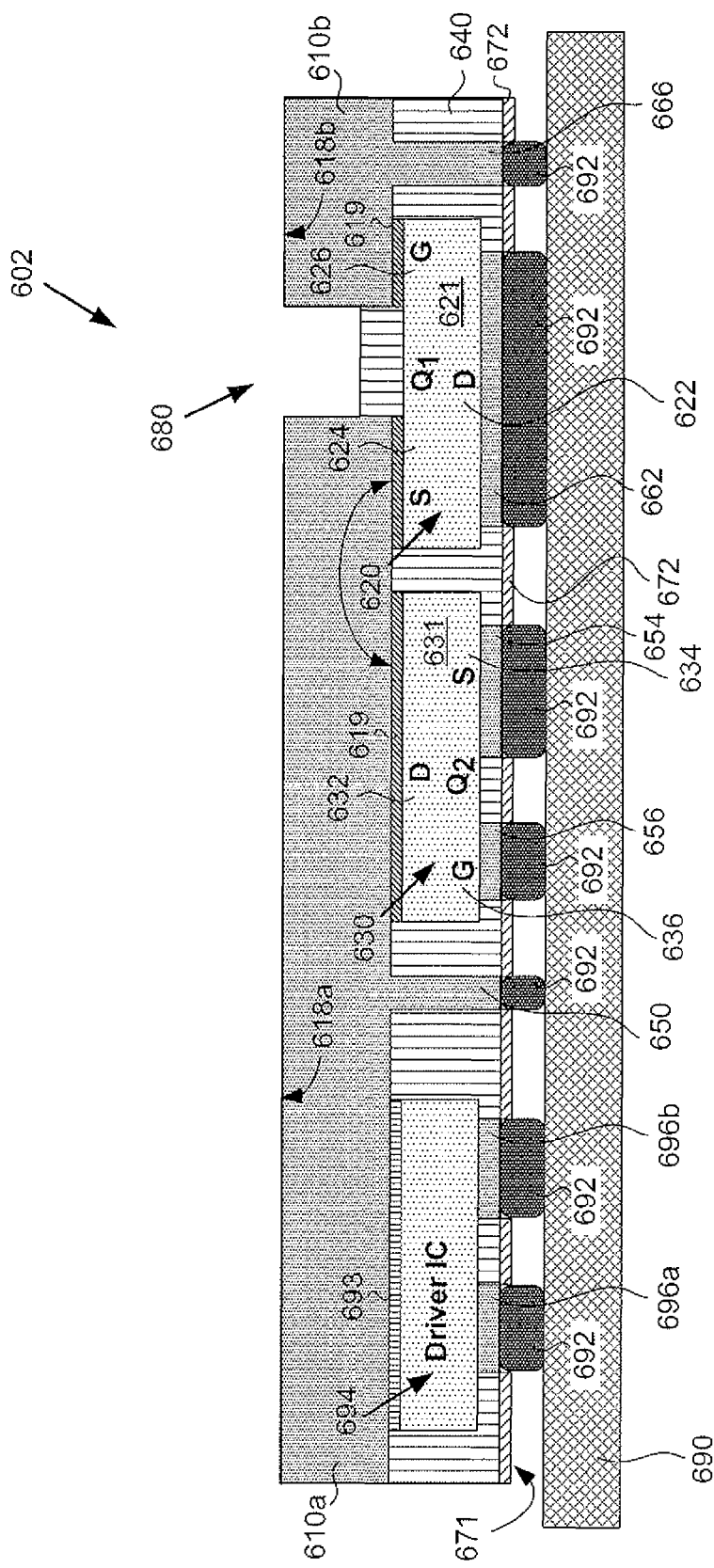
FIG. 6 shows a cross-sectional view of an exemplary semiconductor package including conductive carrier coupled power switches and a driver IC for driving one or both of the power switches, according to another implementation.

Referring now to FIG. 6, FIG. 6 shows a cross-sectional view of an exemplary semiconductor package including conductive carrier coupled power switches and a driver IC for driving one or both of the power switches, according to another implementation. FIG. 6 shows MCM 602 mounted on PCB 690 by solder bodies 692 at surface 671 of MCM 602. MCM 602 includes control active die 621 providing vertical FET 620 having drain 622, source 624, and gate 626, and implementing control switch $Q_1$. In addition, MCM 602 includes sync active die 631 providing vertical FET 630 having drain 632, source 634, and gate 636, and implementing sync switch $Q_2$. MCM 602 also includes driver IC 694 for driving one or both of control and sync switches $Q_1$ and $Q_2$.

MCM 602 further includes conductive carriers 610a and 610b having respective surfaces 618a and 618b, electrically conductive die attach material 619, patterned dielectric 640, and patterned insulator layer 672 providing surface 671. It is noted that isolation trench 680 is partially filled by patterned dielectric 640. Also included in MCM 602 are drain contact 662, source contact 654, gate contacts 666 and 656, switch node contact 650, input/output (I/O) pads 696a and 696b of driver IC 694, and die attach material 693 for attaching driver IC 694 to conductive carrier 610a.

Conductive carriers 610a and 610b, vertical FETs 620 and 630, and electrically conductive die attach material 619 correspond respectively to conductive carriers 210a and 210b, first and second vertical FETs 220 and 230, and electrically conductive die attach material 219, in FIG. 2. In addition, patterned dielectric 640, isolation trench 680, contacts 662, 666, 650, 654, and 656, and patterned insulator layer 672, in FIG. 6, correspond respectively to patterned dielectric 240, isolation trench 280, contacts 262, 266, 250, 254, and 256, and patterned insulator layer 272, in FIG. 2. Moreover, die attach material 693, in FIG. 6, corresponds to die attach material 593, in FIG. 5. Furthermore, it is noted that MCM 602 including driver IC 694, in FIG. 6, corresponds in general to MCM 102 including driver IC 194, in FIG. 1.

As shown in FIG. 6, conductive carrier 610a advantageously provides switch node contact 650 and thereby couples source 624 of vertical FET 620 to drain 632 of vertical FET 630. In addition, isolation trench 680 provides electrical isolation between conductive carrier 610b, providing gate contact 666 of vertical FET 620, and conductive carrier 610a providing switch node contact 650. It is noted that although not shown in FIG. 6, in some implementations, MCM 602 may include a heat spreader. For example, a heat spreader corresponding to heat spreader 286 in FIG. 2 may be attached to conductive carrier 610a at surface 618a.

Thus, by configuring a conductive carrier utilized as a structural support to couple a control switch and a sync switch of a power converter switching stage, the packaging solutions disclosed herein advantageously enable a highly compact package design. In addition, by configuring the control and sync switches to be flipped relative to one another, the present solution enables omission of a conductive clip, or any other feature implemented solely or primarily as a switch node electrical connector, from an MCM package. Moreover, implementations of the present solution advantageously provide a reliable, low resistance, and substantially parasitic free electrical connection for establishing a power converter switch node.

From the above description it is manifest that various techniques can be used for implementing the concepts described in the present application without departing from the scope of those concepts. Moreover, while the concepts have been described with specific reference to certain implementations, a person of ordinary skill in the art would recognize that changes can be made in form and detail without departing from the scope of those concepts. As such, the described implementations are to be considered in all respects as illustrative and not restrictive. It should also be understood that the present application is not limited to the particular implementations described herein, but many rearrangements, modifications, and substitutions are possible without departing from the scope of the present disclosure.

The invention claimed is:

1. A semiconductor package comprising:
a first vertical FET in a first active die having a first source and a first gate on a source side of said first active die and a first drain on a drain side of said first active die;
a second vertical FET in a second active die having a second source and a second gate on a source side of said second active die and a second drain on a drain side of said second active die;
a first conductive carrier attached to said source side of said first active die and to said drain side of said second active die; wherein said first conductive carrier:
includes a side surface of said first conductive carrier is exposed;
electrically couples said first source to said second drain, and
carries the first vertical FET and the second vertical FET by providing structural support element of said semiconductor package;
a second conductive carrier attached to said first gate on said source side of said first active die.

2. The semiconductor package of claim 1, wherein said first conductive carrier comprises a lead frame.

3. The semiconductor package of claim 1, wherein said first conductive carrier is a pre-patterned conductive carrier.

4. The semiconductor package of claim 1, wherein said first and second vertical FETs comprise silicon FETs.

5. The semiconductor package of claim 1, wherein said first and second vertical FETs comprise III-Nitride FETs.

6. The semiconductor package of claim 1, wherein said first and second vertical FETs are utilized to implement a switching stage of a buck converter.

7. A semiconductor package comprising:
   a power converter switching stage including a control switch in a control active die and a sync switch in a sync active die, each of said control and sync active dies having a first die side and a second die side;
   a first conductive carrier attached to said control active die at said first die side of said control active die, and to said sync active die at said second die side of said sync active die;
   wherein said first conductive carrier:
      includes a side surface that is exposed;
      provides a switch node of said power converter switching stage; and
      carries said control active die and said sync active die by providing a structural support element of said semiconductor package;
   a second conductive carrier attached to said control active die at said first die side of said control active die.

8. The semiconductor package of claim 7, wherein said first conductive carrier comprises a lead frame.

9. The semiconductor package of claim 7, wherein said first conductive carrier is a pre-patterned conductive carrier.

10. The semiconductor package of claim 7, wherein said control switch and said sync switch comprise silicon transistors.

11. The semiconductor package of claim 7, wherein said control switch and said sync switch comprise III-Nitride transistors.

12. The semiconductor package of claim 7, wherein said power converter switching stage is implemented as part of a buck converter.

13. A method for fabricating a semiconductor package, said method comprising:
   providing a first vertical FET in a first active die having a first source and a first gate on a source side of said first active die and a first drain on a drain side of said first active die;
   providing a second vertical FET in a second active die having a second source and a second gate on a source side of said second active die and a second drain on a drain side of said second active die;
   attaching a first conductive carrier to said source side of said first active die and to said drain side of said second active die, wherein a side surface of said first conductive carrier is exposed;
   utilizing said first conductive carrier to:
      couple said first source to said second drain, and
      carry the first vertical FET and the second vertical FET by providing a structural support element of said semiconductor package;
   attaching a second conductive carrier to said first gate on said source side of said first active die.

14. The method of claim 13, wherein said first conductive carrier comprises a lead frame.

15. The method of claim 13, wherein said first conductive carrier is a pre-patterned conductive carrier.

16. The method of claim 13, wherein said first and second vertical FETs comprise silicon FETs.

17. The method of claim 13, wherein said first and second vertical FETs comprise III-Nitride FETs.

18. The method of claim 13, wherein said first and second vertical FETs are utilized to implement a switching stage of a buck converter.

19. The semiconductor package of claim 1, wherein said first conductive carrier and said second conductive carrier are pre-patterned conductive carriers.

20. The semiconductor package of claim 7, further comprising a driver integrated circuit (IC) for driving at least one of said control switch and said sync switch.

* * * * *